United States Patent
Welser

(10) Patent No.: US 8,866,005 B2
(45) Date of Patent: Oct. 21, 2014

(54) INGAP HETEROJUNCTION BARRIER SOLAR CELLS

(75) Inventor: Roger E. Welser, Providence, RI (US)

(73) Assignee: Kopin Corporation, Taunton, MA (US)

(*) Notice: Subject to any disclaimer, the term of this patent is extended or adjusted under 35 U.S.C. 154(b) by 874 days.

(21) Appl. No.: 12/579,465

(22) Filed: Oct. 15, 2009

(65) Prior Publication Data
US 2010/0096010 A1 Apr. 22, 2010

Related U.S. Application Data

(60) Provisional application No. 61/196,532, filed on Oct. 17, 2008.

(51) Int. Cl.
| H01L 31/00 | (2006.01) |
| H01L 31/0232 | (2014.01) |
| H01L 31/065 | (2012.01) |
| H01L 31/0352 | (2006.01) |
| H01L 31/0304 | (2006.01) |
| H01L 31/0336 | (2006.01) |

(52) U.S. Cl.
CPC ...... *H01L 31/065* (2013.01); *H01L 31/035209* (2013.01); *H01L 31/035236* (2013.01); *H01L 31/03042* (2013.01); *H01L 31/0336* (2013.01); Y02E 10/544 (2013.01); Y10S 977/755 (2013.01); Y10S 977/774 (2013.01)
USPC ........ 136/256; 257/E31.127; 438/69; 438/87; 438/94; 977/755; 977/774

(58) Field of Classification Search
CPC ............. H01L 31/03042; H01L 31/065; H01L 31/0336; H01L 31/035209; H01L 31/035236; Y02E 10/544
USPC ......... 136/256; 257/E31.127; 438/69, 87, 94; 977/755, 774
See application file for complete search history.

(56) References Cited

U.S. PATENT DOCUMENTS

| 4,860,066 A * | 8/1989 | Kirchner et al. .............. 257/184 |
| 2004/0079408 A1 * | 4/2004 | Fetzer et al. .................. 136/262 |
| 2005/0183765 A1 * | 8/2005 | Ho et al. ....................... 136/251 |

(Continued)

OTHER PUBLICATIONS

Kitatani et al., "Optimal growth procedure of GaInP/GaAs heterostructure for high efficiency solar cells", Solar Energy Materials, 1998.*

(Continued)

*Primary Examiner* — Matthew Martin
(74) *Attorney, Agent, or Firm* — Hamilton, Brook, Smith & Reynolds, P.C.

(57) ABSTRACT

A new solar cell structure called a heterojunction barrier solar cell is described. As with previously reported quantum-well and quantum-dot solar cell structures, a layer of narrow band-gap material, such as GaAs or indium-rich InGaP, is inserted into the depletion region of a wide band-gap PN junction. Rather than being thin, however, the layer of narrow band-gap material is about 400-430 nm wide and forms a single, ultra-wide well in the depletion region. Thin (e.g., 20-50 nm), wide band-gap InGaP barrier layers in the depletion region reduce the diode dark current. Engineering the electric field and barrier profile of the absorber layer, barrier layer, and p-type layer of the PN junction maximizes photogenerated carrier escape. This new twist on nanostructured solar cell design allows the separate optimization of current and voltage to maximize conversion efficiency.

25 Claims, 4 Drawing Sheets

(56) References Cited

U.S. PATENT DOCUMENTS

| | | |
|---|---|---|
| 2005/0247339 A1 | 11/2005 | Barnham et al. |
| 2007/0068572 A1* | 3/2007 | Fetzer et al. ............ 136/262 |
| 2007/0137695 A1* | 6/2007 | Fetzer et al. ............ 136/255 |

OTHER PUBLICATIONS

Alemu, A., et al., "Dependence of Device Performance on Carrier Escape Sequence in Multi-quantum-well *p-i-n* solar cells," *J. of Applied Physics* 99:084506-1-084506-5 (2006).

Asbeck, P.M., et al., "Heterojunction Bipolar Transistor Technology." In *Introduction to Semiconductor Technology: GaAs and Related Compounds*. C.T. Wang, eds. (NY: John Wiley & Sons), pp. 195-203; 179-187.

Barnham, K.W.J., et al., "A New Approach to High-efficiency Multi-band-gap Solar Cells," *J. Appl. Phys.* 67(7):3490-3493 (1990).

Bushnell, D.B., et al., "Effect of Well Number on the Performance of Quantum-well Solar Cells," *J. Appl. Phys.* 97:124908-1-124908-4 (2005).

Dodd, P.E., et al., "Surface and Perimeter Recombination in GaAs Diodes: An Experimental and Theoretical Investigation," *IEEE Transactions on Electron Devices* 38(6):1253-1261 (1991).

Henry, C.H., "Limiting Efficiencies of Ideal Single and Multiple Energy Gap Terrestrial Solar Cells," *J. Appl. Phys.* 51(8):4494-4500 (1980).

Kim, I.-J., et al., "Band Line-up Transition in $Al_xGa_{1-x}As/In_{0.5}Ga_{0.5}P$ from Capacitance-voltage Analysis," *Appl. Phys. Lett.* 68(24): 3488-3490 (1996).

Kurtz, S.R., et al., "High Efficiency GaAs Solar Cells Using $GaInP_2$ Window Layers," *Solar Energy Research Institute*:138-140 (1990).

Marti, A., et al., "Emitter Degradation in Quantum Dot Intermediate Band Solar Cells," *Applied Physics Letters* 90:233510-1-233510-3 (2007).

Mochizuki, K., et al., "GaIn/GaAs Collector-Up Tunneling-Collector Heterojunction Bipolar Transistors (C-Up TC-HBTs): Optimization of Fabrication Process and Expitaxial Layer Structure for High-Efficiency High-Power Amplifiers," *IEEE Transactions on Electron Devices* 47(12): 2277-2283 (2000).

Wei, G., et al., "Thermodynamic Limits of Quantum Photovoltaic Cell Efficiency," *Appl. Physics Letters* 91:223507-1-223507-3 (2007).

Welty, R.J., et al., "Design and Performance of Tunnel Collector HBTs for Microwave Power Amplifiers," *IEEE Transactions on Electron Devices* 50(4):894-900 (2003).

* cited by examiner

INGAP HETEROJUNCTION BARRIER SOLAR CELLS

RELATED APPLICATION

This application claims the benefit of U.S. Provisional Application No. 61/196,532, filed on Oct. 17, 2008. The entire teachings of the above application are incorporated herein by reference.

GOVERNMENT SUPPORT

The invention was supported, in whole or in part, by grant NNX08CB49P from the Small Business Innovative Research (SBIR) Program of the U.S. National Aeronautics and Space Administration (NASA). The Government has certain rights in the invention.

BACKGROUND OF THE INVENTION

The performance of photovoltaic solar arrays and the underlying solar cell devices is typically characterized by the solar electric conversion efficiency. The solar electric conversion efficiency is governed, in turn, by the amount of current induced by incident light and the operating voltage of the device. In traditional single-junction semiconductor solar cells, the conversion efficiency is typically limited to less than 25% of the incident solar power. Photons with energies below the band-gap of the semiconductor pass right through the device and do not contribute to the photo-generated current. High energy photons can be absorbed, but the resulting electrons are collected and extracted at a lower voltage limited by the semiconductor band-gap. Any difference in energy between the photon and the semiconductor energy gap is lost as heat.

Multijunction cells increase the operating voltage, and hence the efficiency, of traditional solar cells by stacking multiple p-n junctions of different semiconductor materials into one two-terminal device. State-of-the-art solar cells have achieved impressive levels of performance in recent years by serially connecting three p-n junctions in one monolithic structure. The best InGaP/GaInAs/Ge three-junction cells have demonstrated one-sun solar conversion efficiencies over 30%, and now exceed 40% under concentrated light. Even higher conversion efficiencies are being pursued by stacking as many as six junctions in one device structure. While initially developed for space power applications, advanced multijunction III-V solar cells are also beginning to make an impact on the terrestrial market. Concentrator photovoltaic systems, which replace expensive semiconductor materials with cheaper plastic lenses and/or metal mirrors, can reduce overall photovoltaic module costs while improving performance, particularly when employing high efficiency III-V cells.

As an alternative to the bulk, multiple-junction approach for achieving high conversion efficiencies, researchers at Imperial College in London have advocated inserting quantum wells into the depletion region of a single-junction solar cell. With this approach, the absorption edge of the solar cell can be extended to lower photon energies, increasing the photon generated current while, ideally, maintaining a high operating voltage. For more on quantum-well solar cells, see U.S. patent application Ser. No. 10/841,843 to Barnham et al., incorporated herein by reference in its entirety.

Suzuki and others have expanded the nanostructured solar cell concept to include quantum dots in addition to quantum wells inside the junction. Ultimately, Marti and co-workers have pointed out that by harnessing a two-step photon absorption process, a single-junction quantum dot solar cell can, in theory, have conversion efficiencies exceeding 60%, which equals or exceeds the theoretical performance of most practical multijunction devices.

Previous reports suggest that at low bias, the dark current of AlGaAs-based PIN photodiodes varies with the location of GaAs wells. At higher bias, however, the insertion of GaAs wells leads to a marked degradation in the dark current. In addition, embedding wide InGaAs wells in InP diodes results in diodes with higher dark currents than structures employing thin wells. Thus, at least one belief in the research community is that "simply using an extended region of narrow band-gap material rather than quantum wells would lead to severe voltage degradation," as expressed in A. Alemu et al., "Dependence of Device Performance on Carrier Escape Sequence in Multi-Quantum-Well p-i-n Solar Cells," J. App. Phys., vol. 99, no. 084506, May 2006, incorporated herein by reference in its entirety. Regardless of whether wells or dots are employed in a nanostructured solar cell, it is now believed two critical physical phenomena should be realized in order to achieve any improvements in efficiency: first, the carriers generated by photon absorption in the lower energy gap material should be able to escape before recombining; and second, the diode dark current should not be significantly degraded by the insertion of narrow band-gap material.

Ragay et al. previously proposed an alternative solar cell device with wide band-gap material and narrow band-gap material in F. W. Ragay, "GaAs—AlGaAs Heterojunction Solar Cells with Increased Open-Circuit Voltage," First World Conference on Photovoltaic Energy Conversion, pp. 1934-1937, December 1994, incorporated herein by reference in its entirety. In the Ragay device, however, the transition from the wide band-gap material to the narrow band-gap material occurs outside of the depletion region. Thus, a built-in field cannot be used to assist the thermionic emission of photogenerated carriers over the barrier in the Ragay structure.

Therefore, a need exists for a solar cell that overcomes or minimizes the above-referenced problems.

SUMMARY OF THE INVENTION

The invention generally is directed to a solar cell device structure called a heterojunction barrier solar cell (HBSC) and a method of making HBSCs.

An HBSC includes an epitaxial PN junction, which includes a p-type layer, an n-type layer, and a depletion region between the p- and n-type layers, formed in a wide band-gap semiconductor (e.g., $E_g \approx 1.9$ eV) via standard industry practices, such as metal organic chemical vapor deposition. Inserting an ultrawide layer of narrow band-gap material and an InGaP barrier layer into the depletion region of the PN junction transforms the PN junction into an HBSC of the present invention.

Embodiments of the present invention include a method of making an HBSC using a wide band-gap PIN diode with a wide absorber layer formed of narrow band-gap material between the p-type and n-type layers of the PIN diode. An HBSC is fabricated by inserting an InGaP barrier layer between the p-type and n-type layers of the PIN diode.

Employing an ultrawide layer of narrow band-gap material enhances the photovoltaic conversion efficiency of the HBSC with respect to that of traditional semiconductor solar cells. Because HBSCs use ultrawide wells instead of multiple thin layers, HBSCs are in some ways the opposite of traditional quantum-well or quantum-dot solar cells: the wide band-gap material of the PN junction offers a potential increase in the open-circuit voltage, whereas the narrow band-gap material in quantum-well and quantum-dot solar cells enables a potential increase in the short-circuit current. In addition, the electric field and barrier profiles of an HBSC can be tailored to maximize the photocurrent at forward bias and to enhance thermionic emission of photogenerated carriers. Thus, HBSCs offer significant increases in open-circuit voltage without compromising the short-circuit current of either InGaP- and GaAs-based PIN diodes.

Contrary to previous reports and expectations, experimental results suggest that inserting wide regions of narrow band-gap material does not significantly degrade the dark diode characteristics. Instead, these results suggest that well position rather than well thickness largely dictates the dark current of InGaP-based PIN diodes incorporating GaAs layers. Experimental results further suggest that the InGaP barrier also lowers the dark current, reducing both hole diffusion from the p-type layer and space-charge recombination within the depletion region. It is also believed that the wide band-gap material of the PN junction makes it possible to achieve low dark currents that are relatively insensitive to temperature and radiation. As a result, HBSCs have low, stable dark currents, which are preferred for achieving high operating voltages.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
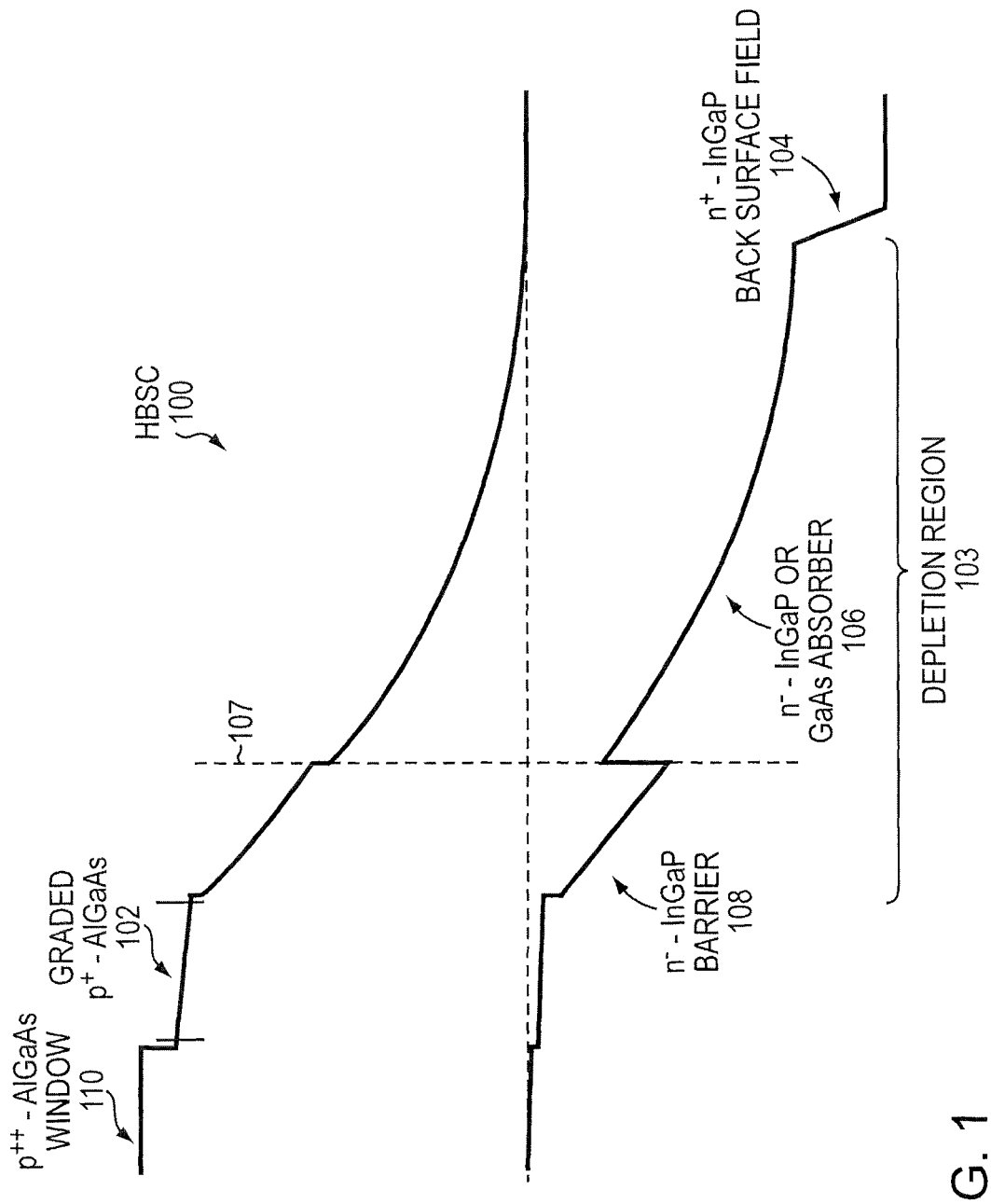
FIG. 1 is a simplified energy band diagram of an InGaP heterojunction barrier solar cell. A single ultrawide GaAs or lower-energy band-gap InGaP absorber well is placed within the depletion region of an otherwise wide band-gap PIN diode.

A heterojunction barrier solar cells (HBSCs) of the invention is formed by inserting an extended region of narrow band-gap material and an InGaP barrier layer into the depletion region of a wide band-gap PN junction used as a III-V single-junction solar cell. Without being bound by a particular theory, it is believed that inserting the wide layer of narrow band-gap material increases the open-circuit voltage of the solar cell without degrading the solar cell's short-circuit current. As a result, an HBSC of the invention is, in some ways, the opposite of a traditional quantum-well or quantum-dot solar cell, which use narrow band-gap materials to increase the short-circuit current.

AlGaAas and InGaP PIN diodes and PN junctions can be used to make HBSCs of the invention with standard semiconductor deposition processes, including metal organic chemical vapor deposition (MOCVD) and molecular beam epitaxy. Both of these material synthesis techniques are well known in the art, and serviced by equipment manufacturers such as Aixtron, Veeco, and Riber. The experimental work described below was done via MOCVD on an Aixtron system. For example, diodes and junctions can be formed of nearly lattice-matched, slightly indium-rich InGaP. Alternatively, diodes and junctions may have a p-type layer formed of AlGaAs with a graded field profile. Generally, HBSCs are made by inserting a narrow band-gap material, such as GaAs, which has a band-gap energy of about 1.42 eV, into the depletion region of an InGaP PIN diode with a band-gap energy of about 1.9 eV. The narrow band-gap layer, also called an absorber layer, can be between about 100 nm and 1.0 µm thick, with 500 nm thicknesses being typical. (For example, the narrow band-gap layer can be between about 430 nm and 450 nm thick, as in the experimental devices described below.)

An InGaP barrier layer, which has a band-gap energy of 1.93 eV or more, is inserted next to the p-type layer of the InGaP PIN diode. The InGaP barrier layer has a thickness of between about 20 nm and about 50 nm. The barrier layer may also be about 20, 25, 30, 35, 40, 45, or 50 nm thick. The InGaP barrier layer can be lattice-mismatched and slightly gallium rich with respect to the InGaP PN junction.

In general, the absorber gap layer and the barrier layer are in the part of the depletion region where photon absorption occurs. Together, the absorption and barrier layers can be anywhere from about 100 nm thick to up to about 3.0 µm thick, with 1.0-2.0 µm thicknesses being typical to provide significant absorption. Although the narrow band-gap layer and the barrier layer can occupy the entire depletion region, quantum wells, transitional layers, and graded layers may be added to enhance performance.

Characteristics of the barrier layer and the absorber layer, such as their field profiles, can be tailored to maximize photocurrent at forward bias. Some HBSCs of the invention include InGaAs wells inserted into the absorber layer and/or an AlGaAs window disposed over the p-type layer of the PIN diode.

FIG. 1 shows the basic energy band schematic of an InGaP HBSC 100 of the invention. The HSBC 100 is formed of a wide band-gap PN junction (e.g., $E_g \approx 1.9$ eV) that includes a p-type emitter layer 102 separated from an n-type back surface field layer 104 by a depletion region 103. Si-doped InGaP is used for the $n^+$-type back surface field layer 104, which also acts as a back surface field. Carbon-doped AlGaAs alloys are employed for the top $p^+$-type emitter layers 102 in order to avoid problems associated with zinc diffusion. The HBSC structure 100 also includes a $p^{++}$-doped AlGaAs window 110 adjoining the $p^+$-type emitter layer 102.

Using $p^+$ AlGaAs material in the $p^+$-type emitter layer 102 has negligible impact on the diode characteristics at the aluminum compositions (>30%) used here. Moreover, the p+-type AlGaAs emitter layer 102 forms a convenient type II staggered band line-up with InGaP lattice-matched to GaAs, avoiding unwanted barrier issues found in more common type I heterojunctions. In addition, the use of AlGaAs compositional grading in the $p^+$-type emitter layer 102 to create built-in fields can further enhance minority carrier properties.

A lightly doped n-type absorption layer 106 and a nominally undoped wide band-gap barrier layer 108 are placed in the depletion region 103 of the p⁺-n⁺ junction to form the HBSC 100. The absorption layer 106 can include InGaAs, GaAs, which has a band-gap energy of about 1.42 eV, or slightly indium-rich InGaP, which has a band gap energy of about 1.89 eV. The absorption layer 106 is about 400-430 nm thick, depending on the thickness of the barrier layer 108.

The barrier layer 108, which can be n⁻-doped InGaP, directly adjoins the p⁺-type emitter layer 102 and reduces both hole injection from the p-type AlGaAs emitter layer 102 and space-charge recombination within the depletion region 106. The use of tensile-strained, gallium-rich alloys ensures a large energy-gap ($E_g$>1.93 eV) in the barrier layer 108. The optimal thickness of the InGaP barrier layer 108 is between about 20 nm and about 50 nm, and can be about 20, 25, 30, 35, 40, 45, or 50 nm thick. The total barrier plus absorber layer thickness can be approximately 450 nm Photogenerated electron collection is largely unencumbered in this structure 100, while the collection of photogenerated holes requires field-assisted thermionic emission to overcome the potential barrier at the InGaP barrier/absorber well interface 107. In some cases, the barrier profile opposite the p⁺ AlGaAs layer 102 is tailored, along with the built-in field, to enhance the thermionic emission of holes from the narrow band-gap absorber. InGaAs wells can also be added in the absorber layer 106 to capture lower energy photons.

Carrier Escape and Dark Current Mechanisms

The extraction efficiency of photogenerated carriers from a potential well, such as the ultrawide, narrow band-gap layer 106 shown in FIG. 1, is determined by the ratio of the escape and recombination rates, and can approach 100% by minimizing the escape time relative to the recombination time. Carrier escape from quantum well structures is generally accomplished by thermionic emission, aided by the presence of a strong electric field. In typical nanostructured solar cell designs the well thickness exerts competing effects, with thin wells reducing escape time but also resulting in less absorption. Quantum phenomena are not required to achieve field-assisted thermionic emission, however, and ultrawide wells can, in principle, obtain efficient carrier escape while maximizing absorption. Indeed, the InGaP HBSCs described here exhibit saturated photocurrents consistent with 100% collection efficiency.

Dark diode currents typically include several different components, and the impact of inserting narrow band-gap material on the diode current should be evaluated for each separate physical process. One measure of dark diode current is an ideality factor, n, that describes how closely the solar cell's actual performance matches its theoretical performance. For perfect matches, n=1. For more on ideality factors and semiconductor physics in general, see "Introduction to Semiconductor Technology: GaAs and Related Compounds," C. T. Wang, editor, John Wiley & Sons, May 1990, incorporated herein by reference in its entirety. (Chapter 4 in Wang focuses on heterojunction bipolar transistor technology.)

At low bias, carrier recombination within the junction space charge region dominates the dark current of most practical p-n junction devices. This space-charge recombination exhibits a voltage dependence with an ideality factor near two (n≈2), and, in general, is expected to be concentrated in a region near where the electron and hole densities are equal. Thus any degradation in the n=2 component of the dark current can in principle be minimized by avoiding the formation of extra defects at the interfaces and by keeping the low band-gap material out of the region of high recombination rates.

At higher bias, diffusion-driven injection currents with ideality factors approaching one tend to describe the dark diode characteristics. In particular, the diffusion of electrons from the n-type material into the p-type material generates a current that is proportional to the n-type doping level, but limited by the electron diffusion barrier. Likewise, the diffusion of holes from the p-type material into the n-type material generates a current that is proportional to the p doping level but limited by the hole diffusion barrier. The height of the electron and hole diffusion barriers is largely set by the energy gaps of the p-type and n-type materials, respectively, and offset by the applied voltage and the position of the quasi-Fermi levels. While the insertion of narrow band-gap material into the depletion region can certainly affect the local carrier distribution, it should not alter the total diffusion barrier heights that injected electrons and holes must overcome. However, the insertion of narrow band-gap material close to regions of heavily doped wide band-gap material can result in tunneling currents, which have been experimentally observe to be an important current mechanism in InGaP/GaAs structures.

Ultimately, radiative recombination is expected to limit the dark current of ideal p-n junctions, and is often used to describe the theoretical limit on solar cell efficiency. Radiative recombination currents are typically calculated using the laws of thermodynamics and statistical mechanics assuming bulk cells in equilibrium. However, some researchers have pointed out that these assumptions may not be valid for quantum well solar cells. Indeed, the physical separation of electrons and holes that can occur within the depletion region may actually reduce radiative recombination, regardless of whether quantum wells or dots are employed.

EXAMPLE 1

InGaP Absorber Structure

HBSCs employing InGaP alloys for both the barrier and absorber layers werebuilt by inserting 30-50 nm wide, lattice-mismatched, gallium-rich InGaP layers into nearly lattice-matched, but slightly indium-rich InGaP-based PIN diode controls. The example HBSC structures were grown on MOCVD tools also employed for Kopin's high-volume heterojunction bipolar transistor (HBT) wafer production. The InGaP alloys are largely disordered, with an energy gap of 1.895 eV when perfectly matched to GaAs, as characterized by photoluminescence and X-ray diffraction measurements. The devices were fabricated with Kopin's standard Quick Lot process used to characterize HBT material. Further details on HBT production can be found in co-assigned U.S. Pat. No. 7,566,948, incorporated herein by reference in its entirety.

Figure 2:
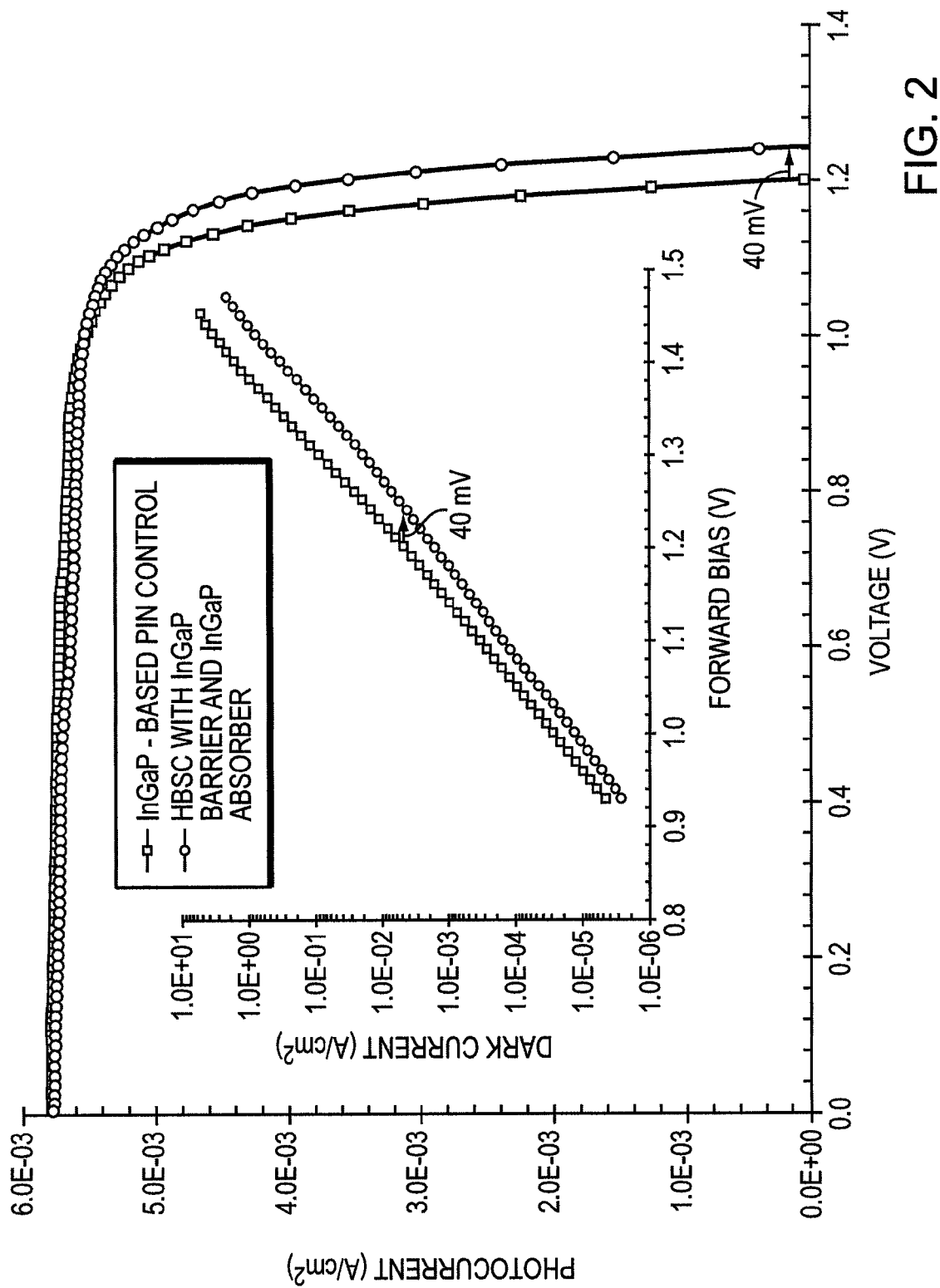
FIG. 2 is a comparison of the illuminated current-voltage characteristics of an InGaP heterojunction barrier structure with an InGaP absorber layer (circles) with an InGaP-based PIN diode control structure (squares). The inset shows dark diode current densities, and the improvement in voltage is highlighted.

FIG. 2 is plot of measured photocurrent versus open-circuit voltage for an HBSC (circles) and a conventional InGaP-based PIN diode control (squares) illuminated with white light. The inset of FIG. 2 shows the dark current, or current flowing when no photons are present, for both devices as a function of forward bias. (Generally, lower dark currents are better.) Both the dark diode and illuminated current characteristics were measured on 200 μm×270 μm base-collector devices as a function of voltage. The photocurrent in simple mesa diode structures is generated by illumination with an uncalibrated halogen lamp through a small aperture in the top metal contact. In practical solar cells, the aperture size is as close to the mesa diode structure size as possible. In these test structures, the aperture area was less than 50% of the mesa diode structure.

As shown in FIG. 2, increasing the irradiance causes both the photocurrent and the open-circuit voltage to increase. Whereas the photocurrent increases linearly with increasing irradiance, the open-circuit voltage increases logarithmically until the barrier opposed to internal charge leakage disappears; the barrier height represents the maximum obtainable photovoltage.

As shown in the inset of FIG. 2, inserting a barrier layer into the depletion region of the PIN diode control causes a reduction in the dark current of approximately 40 mV. The 40 mV reduction in dark current shown in the inset of FIG. 2 translates to a 40 mV increase in the open-circuit voltage in an HBSC illuminated with white light, indicating that the photogenerated carriers were able to escape the energy barrier efficiently at the interface between the indium-rich InGaP and the gallium-rich InGaP. The net result was an improvement in efficiency of the InGaP-based PIN diode control, as the open-circuit voltage was enhanced without degrading the short circuit current.

EXAMPLE 2

GaAs Absorber Structure

In the second example, HBSCs were constructed by replacing the InGaP absorber layer with GaAs, which has a much lower energy-gap ($E_g \approx 1.42$ eV), and varying the thickness of the InGaP barrier layer using the techniques described above with respect to Example 1.

Figure 3:
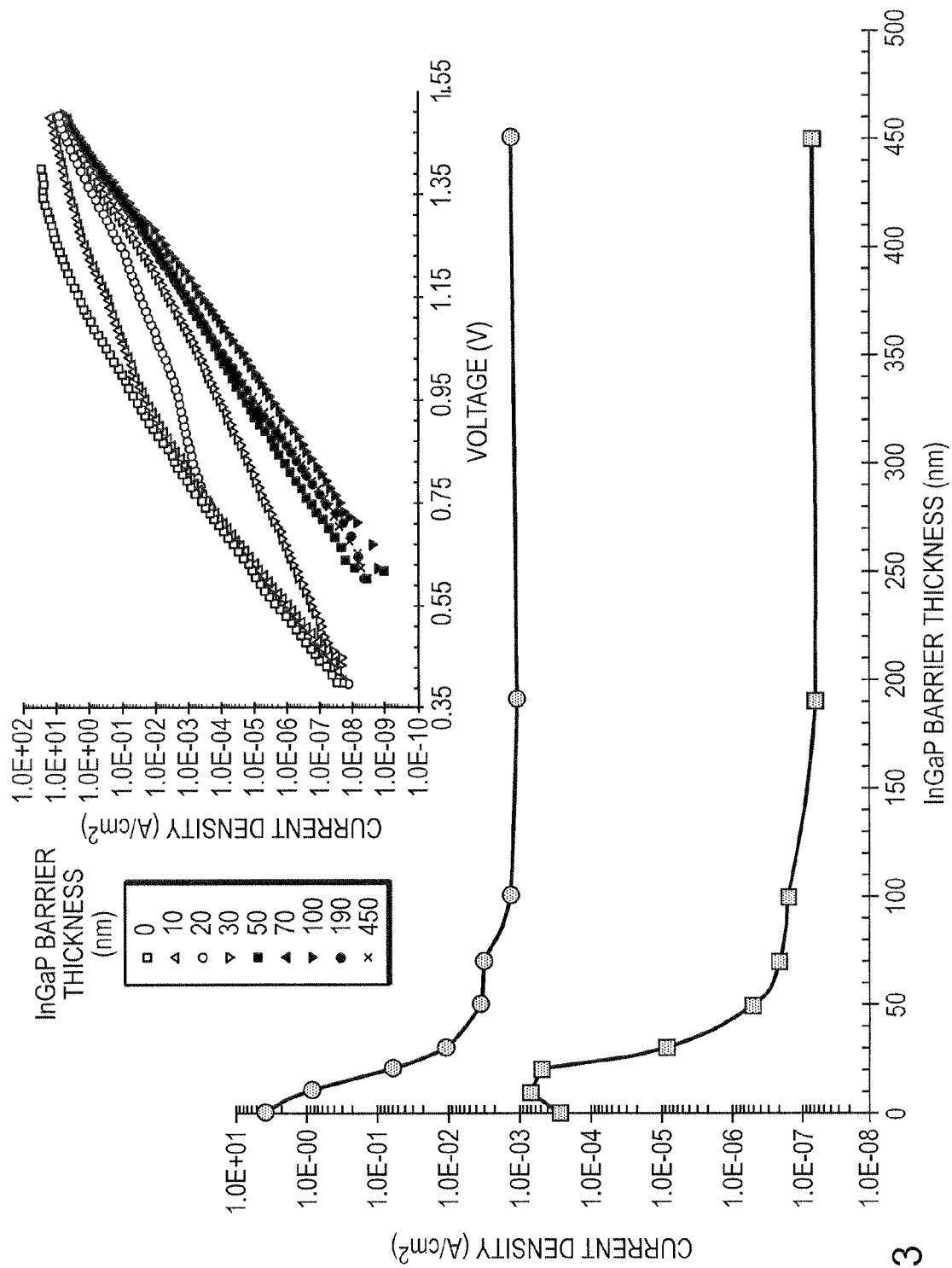
FIG. 3 shows the measured variation in dark diode current density at bias levels of 0.8 V (squares) and 1.2 V (circles) of InGaP-based PIN diodes incorporating a wide GaAs well as a function of InGaP barrier layer thickness (absorption layer position). The inset shows full dark diode current curves.

FIG. 3 is a plot of the measured variation in dark diode current density at two bias levels of 0.8 V (squares) and 1.2 V (circles) of InGaP-based PIN diodes incorporating a wide GaAs well as a function of InGaP barrier layer thickness. The inset of FIG. 3 shows the full dark diode current versus voltage for different InGaP barrier thicknesses. Remarkably, the dark current does not begin to increase significantly until the InGaP barrier thickness drops below 50 nm, as shown in FIG. 3. Even a 30 nm thick InGaP barrier is sufficient to minimize dark current degradation at the higher bias relevant to solar cell operation.

In regions where space-charge recombination dominates, FIG. 3 shows that the ideality factor increases to around two ($n \approx 2$), which is what happens at low bias. As explained above, the space-charge recombination is expected to be concentrated in a region away from the physical p-n junction where the electron and hole densities are nearly equal. In the experimental data plotted in FIG. 3, this region of substantial recombination appears to be concentrated in a thin zone centered at a distance of approximately 25 nm from the junction. Thus degradation in the n=2 component of the dark current can be minimized by keeping the low band-gap material out of this region of high recombination rates.

At intermediate bias, the ideality factor can in some cases actually increase (see FIG. 3 inset), approaching n=2.5. At high bias, however, the ideality factor decreases again, and the overall dark current approaches that of the InGaP-only control diode. This general type of diode characteristic, with transitions from a near n=2 ideality factor to n>2, and then to n~1, with increasing bias, is similar to that observed in InGaP/GaAs tunnel junctions, and has been attributed to a bias-dependent barrier shape. A related phenomenon could be occurring in the HBSC structures as well, with holes tunneling from the p+ AlGaAs through the InGaP barrier and into the GaAs well. When the distance between the GaAs well and the junction is increased further (~50 nm), the tunneling barrier becomes quite large, and the dark current becomes indistinguishable from that of the InGaP-only control diode. The magnitude of this tunneling current appears to be largely insensitive to GaAs well thickness, enabling insertion of a single extremely thick GaAs well (~400 nm) into the depletion region without degrading the dark current characteristics of InGaP-based PIN diodes.

The large energy gap difference between gallium-rich InGaP and the GaAs at the barrier/absorber well interface is a formidable barrier for photogenerated carriers, particularly in the valence band ($\Delta E_v \sim 350$ meV). As a result, initial attempts at synthesizing InGaP heterojunction solar cells with thick GaAs absorber wells yielded very low fill factors. Engineering the band profile at the barrier/well interface and increasing the built-in field at forward bias resulted in a steady increase in the fill factor, until fill factors greater than 0.8 could be obtained in InGaP HBSCs with GaAs absorber wells. As a result, the InGaP HBSCs with GaAs absorber wells had fill factors essentially identical to the PIN control samples.

Figure 4:
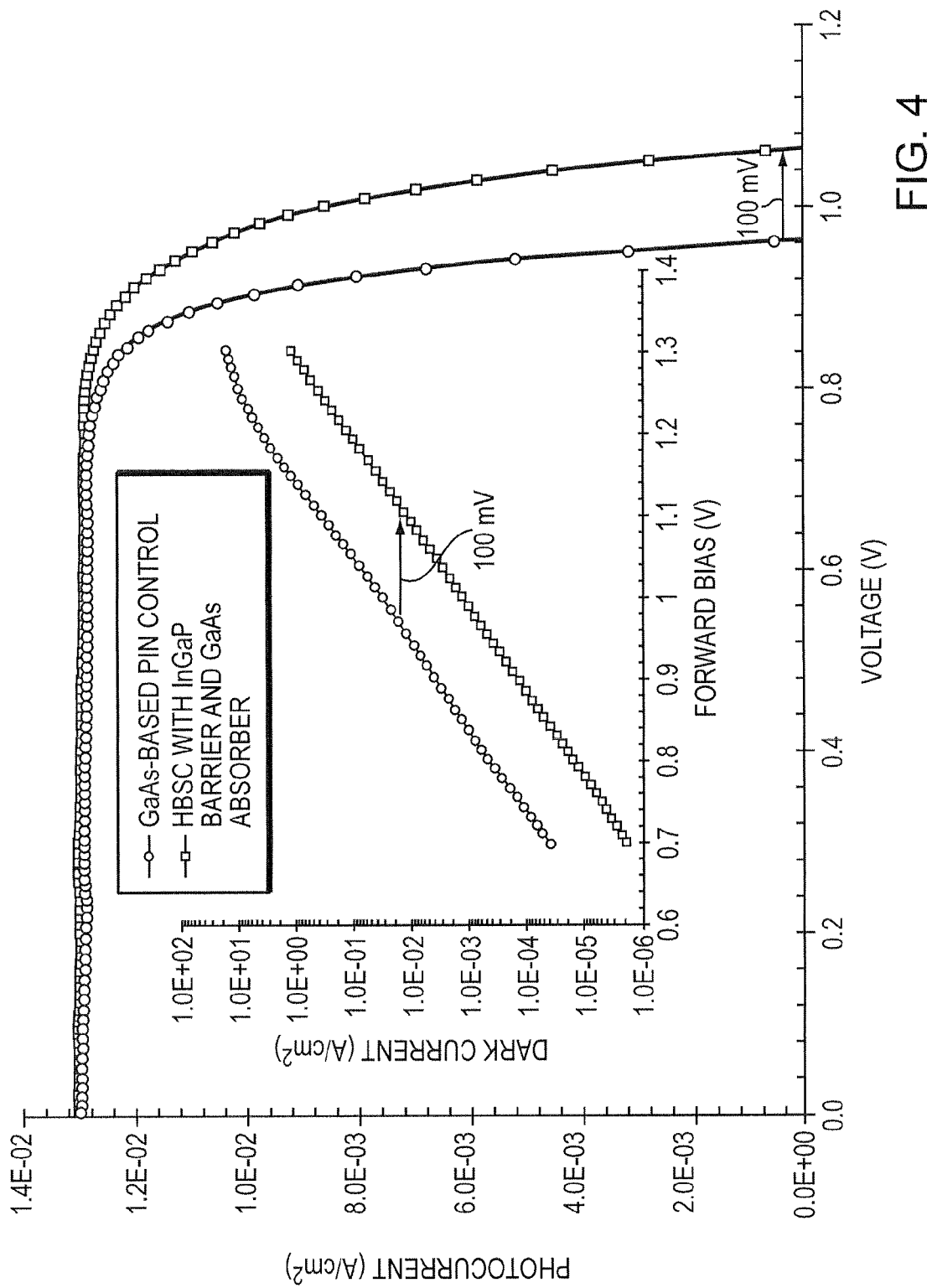
FIG. 4 shows a comparison of the illuminated current-voltage characteristics of an InGaP heterojunction barrier structure with a GaAs absorber layer (squares) with a GaAs-based PIN diode control structure (triangles). The inset shows dark diode current densities, and the improvement in voltage is highlighted.

FIG. 4 is a plot of photocurrent versus voltage for HBSCs (squares) with InGaP barrier layers in GaAs absorber regions and GaAs-based PIN diode controls (triangles). The inset of FIG. 4 shows dark current density versus forward bias for the HBSCs and PIN diode controls. As shown in FIG. 4, InGaP heterojunction barrier solar cell structures have markedly better performance than conventional GaAs absorbed designs. Inserting an InGaP barrier into the depletion region of a GaAs-based PIN diode resulted in over an order of magnitude reduction in the dark current. Moreover, the barrier/well interface and depletion-derived, built-in field in the HBSC was optimized to allow efficient photogenerated escape, even at forward bias. As a result, a 100 mV increase in the open-circuit voltage was obtained, with no reduction in short circuit current. Even greater enhancements in the open-circuit voltage may be possible with further optimization of the electric field and barrier profile.

While this invention has been particularly shown and described with references to example embodiments thereof, it will be understood by those skilled in the art that various changes in form and details may be made therein without departing from the scope of the invention encompassed by the appended claims.

What is claimed is:

1. A solar cell device structure, comprising:
   a) a single, wide band-gap PN junction including a p-type emitter layer, an n-type back surface field layer, and a depletion region between the p-type emitter layer and the n-type layer;
   b) a narrow band gap absorber layer within the depletion region, the narrow band gap absorber layer having a thickness between about 100 nm and 1 micron;
   c) an InGaP barrier layer within the depletion region that directly adjoins the emitter layer and has a thickness between about 20 nm and about 50 nm;
   wherein the narrow band gap absorber layer forms a single, ultrawide well in the depletion region.

2. The solar cell of claim 1, wherein the PN junction has a band-gap of about 1.9 eV.

3. The solar cell of claim 1, wherein the PN junction includes at least one of an AlGaAs alloy and an InGaP alloy.

4. The solar cell of claim 1, wherein the p-type layer is a graded AlGaAs layer.

5. The solar cell of claim 1, wherein the PN junction is nearly lattice-matched, indium-rich InGaP.

6. The solar cell of claim 1, wherein the absorber layer has a band-gap of about 1.42 eV.

7. The solar cell of claim 1, wherein the absorber layer includes at least one of an InGaP alloy, a GaAs alloy, and an InGaAs alloy.

8. The solar cell of claim 1, wherein the InGaP barrier layer has a band-gap of equal to or greater than about 1.93 eV.

9. The solar cell of claim 1, wherein the InGaP barrier layer is lattice-mismatched and gallium rich.

10. The solar cell of claim 1, wherein the total thickness of the InGaP barrier layer and the absorber layer is approximately 500 nm.

11. The solar cell of claim 1, further including InGaAs wells in the absorber layer.

12. The solar cell of claim 11, further including an AlGaAs window disposed over the p-type layer.

13. A method of making a solar cell device structure, comprising the steps of:
   a) providing a single junction wide band-gap PIN diode that includes a p-type emitter layer, an n-type back surface field layer, and a depletion region containing an absorber layer of narrow band-gap material between the p-type and the n-type layers;
   b) inserting an InGaP barrier layer between the p-type and n-type layers directly adjoining the p-type emitter layer;
   wherein the narrow band gap absorber layer is between about 100 nm and 1 micron thick;
   wherein the InGaP barrier layer is between about 20 nm thick and about 50 nm thick:
   wherein the narrow band gap absorber layer forms a single, ultrawide well in the depletion region.

14. The method of claim 13, wherein the band-gap of the PIN diode is about 1.9 eV.

15. The method of claim 13, wherein the PIN diode is an InGaP PIN diode or an AlGaAs PIN diode.

16. The method of claim 15, further including replacing the absorber layer with a GaAs absorber layer or an InGaAs absorber layer.

17. The method of claim 13, wherein the p-type layer is a graded AlGaAs layer.

18. The method of claim 13, wherein the absorber layer has a band-gap energy of about 1.42 eV.

19. The method of claim 13, wherein the PIN diode is includes nearly lattice-matched, slightly indium-rich InGaP.

20. The method of claim 13, wherein the InGaP barrier layer has a band-gap of equal to or greater than about 1.93 eV.

21. The method of claim 13, wherein the InGaP barrier layer is lattice-mismatched and slightly gallium rich.

22. The method of claim 13, wherein the total thickness of the InGaP barrier layer and the absorber layer is approximately 500 nm.

23. The method of claim 13, further including tailoring characteristics of the barrier layer and the absorber layer to maximize a photocurrent at forward bias.

24. The method of claim 13, further including inserting InGaAs wells into the absorber layer.

25. The method of claim 13, further including disposing an AlGaAs window over the p-type layer.

* * * * *